(12) United States Patent
Mori et al.

(10) Patent No.: US 11,037,790 B2
(45) Date of Patent: Jun. 15, 2021

(54) PRESSURIZING DEVICE AND PRESSURIZING METHOD

(71) Applicant: NIKKISO CO., LTD., Tokyo (JP)

(72) Inventors: Takahiro Mori, Higashimurayama (JP); Satoshi Idesako, Higashimurayama (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/095,987

(22) PCT Filed: Feb. 14, 2017

(86) PCT No.: PCT/JP2017/005359
§ 371 (c)(1),
(2) Date: Oct. 24, 2018

(87) PCT Pub. No.: WO2017/187721
PCT Pub. Date: Nov. 2, 2017

(65) Prior Publication Data
US 2019/0139769 A1    May 9, 2019

(30) Foreign Application Priority Data
Apr. 27, 2016 (JP) .............................. JP2016-089812

(51) Int. Cl.
*H01L 21/203* (2006.01)
*B29C 65/00* (2006.01)
(Continued)

(52) U.S. Cl.
CPC ............ *H01L 21/203* (2013.01); *B29C 43/18* (2013.01); *B29C 66/71* (2013.01);
(Continued)

(58) Field of Classification Search
CPC ......... H01L 21/203; H01L 2224/83101; H01L 2224/75; H01L 2224/73204;
(Continued)

(56) References Cited

U.S. PATENT DOCUMENTS 4,490,321 A * 12/1984 Klinkau .................. B29C 43/18
                                                          210/231
4,783,303 A * 11/1988 Imgram .................. B29C 61/02
                                                          264/230

(Continued)

FOREIGN PATENT DOCUMENTS

JP    2004-010384 A    1/2004
JP    2004-058349 A    2/2004
(Continued)

OTHER PUBLICATIONS

English Translation of TW 208234, United States Patent and Trademark Office: Translations Service Center, Irina Knizhnik, dated Sep. 17, 2020 (Year: 1992).*

(Continued)

*Primary Examiner* — Robert C Dye
*Assistant Examiner* — Taryn Trace Willett
(74) *Attorney, Agent, or Firm* — Oliff PLC

(57) ABSTRACT

A pressurizing device includes: a mounting base; an upper mold which pressurizes the target object mounted on the mounting base from above; a heating lower mold which is a lower mold heated in advance by a heater, and which heats the target object under pressure by sandwiching the mounting base with the upper mold; a cooling lower mold which is a lower mold cooled in advance by a cooler, and which cools the target object under pressure by sandwiching the mounting base with the upper mold; and a control device which switches the lower mold that contributes to the pressurization of the target object to the heating lower mold or the cooling lower mold in accordance with the status of progress of the pressurization process for the target object.

5 Claims, 12 Drawing Sheets

(51) Int. Cl.
  *B29C 43/18*  (2006.01)
  *H01L 21/67*  (2006.01)
(52) U.S. Cl.
  CPC .. *H01L 21/67109* (2013.01); *H01L 21/67126* (2013.01); *H01L 2224/73204* (2013.01); *H01L 2224/75* (2013.01); *H01L 2224/83101* (2013.01)
(58) Field of Classification Search
  CPC ......... H01L 21/67109; H01L 21/67126; H01L 21/67092; H01L 21/67098; B29C 66/71; B29C 43/18
  See application file for complete search history.

(56) References Cited

U.S. PATENT DOCUMENTS

| | | | | |
|---|---|---|---|---|
| 5,712,032 | A * | 1/1998 | Balmer | B29C 37/0057 156/304.1 |
| 2003/0195059 | A1 * | 10/2003 | Brum | A63B 37/0003 473/371 |
| 2005/0006482 | A1 * | 1/2005 | Kano | B29C 66/0242 235/488 |
| 2007/0176317 | A1 | 8/2007 | Morita et al. | |
| 2013/0270735 | A1 * | 10/2013 | Alexander | A61B 17/12122 264/248 |
| 2015/0343678 | A1 * | 12/2015 | Takemura | B29C 59/026 264/280 |

FOREIGN PATENT DOCUMENTS

| | | |
|---|---|---|
| JP | 2004-296746 A | 10/2004 |
| JP | 2004-342876 A | 12/2004 |
| JP | 2005-072369 A | 3/2005 |
| JP | 2007-000896 A | 1/2007 |
| JP | 2010-062468 A | 3/2010 |
| JP | 2010-287691 A | 12/2010 |
| JP | 5447110 B2 | 3/2014 |
| TW | 2082234 B * | 11/1992 |
| TW | 208234 | 6/1993 |
| TW | 200502078 A | 1/2005 |

OTHER PUBLICATIONS

Oct. 24, 2019 Office Action issued in European Patent Application No. 17789010.0.

* cited by examiner

US 11,037,790 B2

PRESSURIZING DEVICE AND PRESSURIZING METHOD

TECHNICAL FIELD

The present invention relates to a pressurizing apparatus and a pressurizing method for pressurizing and heating an target object, with a plurality of pressurizing molds.

BACKGROUND

Conventionally, in order to heat and press an target object, a pressurizing apparatus that heats the target object while sandwiching and pressurizing it by a plurality of pressurizing molds is known. For example, Patent Documents 1 and 2 disclose apparatuses that are configured to sandwich and pressurize an target object between a lower mold and an upper mold and heat the target object by a heater incorporated in the mold. Such pressurizing apparatuses are configured to cool the target object while maintaining the pressurizing state, after completing the pressurization and heating of the target object. Then, when the target object is cooled down to a predetermined temperature, the mold is separated from the target object and the target object is taken out.

CITATION LIST

Patent Literature

Patent Document 1: JP 2004-296746 A
Patent Document 2: JP 2007-896 A

SUMMARY

Technical Problem

For the purpose of heating and cooling an target object, a conventional pressurizing apparatus includes a heater and a fluid path for refrigerant, which are provided inside the mold and configured to heat or cool the mold according to the state of progress in processing. However, according to such a configuration, a significant time is required to raise or lower the temperature of the mold having once been cooled or heated to a predetermined level, which results in elongation of time in processing the target object. In addition, when attempting to quickly heat the mold with a heater, overshoot in which the temperature of the mold temporarily exceeds a setting level is liable to occur and unexpected high heat may be added to the target object.

In view of the above, the present invention intends to provide a pressurizing apparatus and a pressurizing method capable of appropriately controlling the temperature of an target object in a short time.

Solution to Problem

A pressurizing apparatus according to the present invention is characterized by including a mounting base on which an target object is mounted, an upper mold for pressurizing the target object mounted on the mounting base from an upper side thereof, a heating lower mold that is a lower mold heated beforehand by heating means and is configured to heat the target object while pressurizing it in a state where the mounting base is sandwiched between the upper mold and the heating lower mold, a cooling lower mold that is a lower mold cooled beforehand by cooling means and is configured to cool the target object while pressurizing it in a state where the mounting base is sandwiched between the upper mold and the cooling lower mold, and a control device for controlling the driving of the molds in such a way as to switch the lower mold contributing to the pressurization of the target object to the heating lower mold or the cooling lower mold according to the state of progress in pressurization processing for the target object.

In a preferred embodiment, an intervening pad intervening between the upper mold and the target object is provided, wherein the intervening pad includes a soft layer flexibly deforming according to the shape of the target object, and a heat insulating layer intervening between the soft layer and the target object for thermally insulating between the target object and the soft layer.

In this case, the heating lower mold desirably heats the target object to a temperature higher than a heatproof temperature of the soft layer.

Further, in this case, the control device desirably brings the intervening pad into contact with the target object to hold the target object by the intervening pad and subsequently causes the heating lower mold to heat and pressurize the target object.

In another preferred embodiment, there are provided a side mold disposed around the upper mold and, when closely contacting with the mounting base, forming a hermetically closed space around the target object together with the upper mold and the mounting base, and a suction apparatus for sucking air from the hermetically closed space to bring the surrounding of the target object into a vacuum state, wherein prior to pressurization of the target object the control device desirably brings the side mold into contact with the mounting base to form the hermetically closed space and drives the suction apparatus to bring the hermetically closed space into the vacuum state.

Another pressurizing method according to the present invention is a pressurizing method for pressurizing and heating an target object mounted on a mounting base, and is characterized by including a heating step of sandwiching the mounting base on which the target object is mounted between an upper mold and a heating lower mold heated beforehand by heating means and heating the target object with heat from the heating lower mold while pressurizing the target object, and a cooling step of sandwiching the mounting base between the upper mold and a cooling lower mold cooled beforehand by cooling means and cooling the target object while pressurizing the target object.

Advantageous Effects of Invention

According to the present invention, since the lower mold contributing to the pressurization of the target object is switched to the heating lower mold heated beforehand or the cooling lower mold cooled beforehand according to the state of progress in pressurization processing, the time required for the heating and cooling can be greatly reduced and the temperature of the target object can be appropriately controlled.

DESCRIPTION OF EMBODIMENTS

Figure 1A:
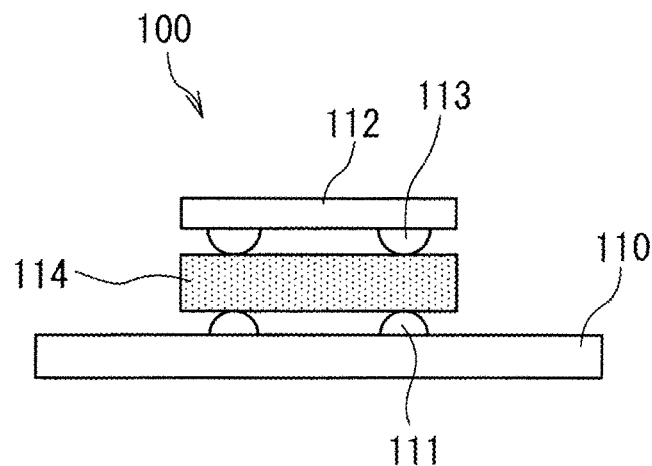
FIGS. 1A-1C are views illustrating the principle of pressurizing an target object by a pressurizing apparatus according to the present embodiment.
Figure 1B:
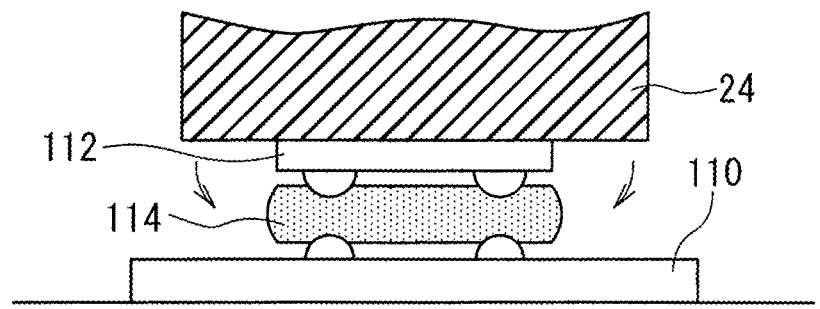
Figure 1C:
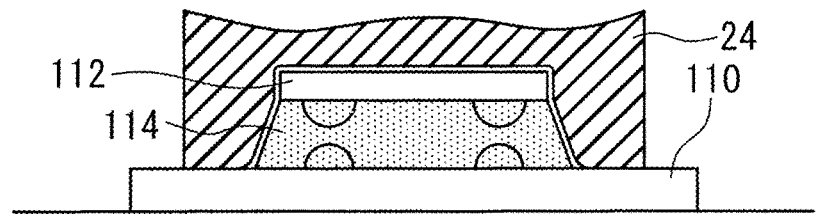

Hereinafter, a pressurizing apparatus 10 according to an embodiment of the present invention will be described below with reference to attached drawings. First, the pressurizing principle of the pressurizing apparatus 10 according to the present embodiment will be described with reference to FIGS. 1A-1C. An target object 100 according to the present embodiment includes a plurality of electronic components 112 to be bonded using a thermosetting adhesive. For example, as illustrated in FIGS. 1A-1C, the target object 100 includes a substrate 110, an electronic component 112 such as a circuit element or the like disposed on the substrate 110, and a sheet-like adhesive 114 intervening between the substrate 110 and the electronic component 112. The substrate 110 has a surface on which a predetermined pattern of wiring 111 is formed. Projections each serving as an electrical contact, which is referred to as a bump 113, are provided on a surface (a lower surface in the drawing) of the electronic component 112 facing the substrate 110. The adhesive 114 is made of a thermosetting adhesive and disposed between the electronic component 112 and the substrate 110. The adhesive 114 is in the form of a sheet having a predetermined shape at an initial stage before the start of pressurization and heating. The adhesive 114, when its temperature exceeds a predetermined glass transition temperature Tg, softens so as to exhibit fluidity and subsequently, when its temperature further increases and exceeds a predetermined curing temperature Tc, hardens irreversibly.

When bonding the electronic component 112 to the substrate 110, the target object 100 is sandwiched between upper and lower molds and then pressurized and heated. The adhesive 114, when heated, softens upon exceeding the glass transition temperature Tg. Further, when the heating continues, the adhesive 114 hardens upon reaching the curing temperature Tc. In the duration after the adhesive 114 softens and before it hardens, by continuously pressurizing the target object 100, a portion of the adhesive 114 sandwiched between the wiring 111 and the bump 113 is compressed, and the bump 113 and the wiring 111 are brought into a mutually conductive state.

In the present embodiment, in order to uniformly pressurize the electronic component 112 and the adhesive 114 from the surrounding (both top and side in the drawings), an upper mold 20 is provided with an intervening pad 24. The intervening pad 24 has sufficient flexibility to deform according to the shape of the target object 100. When the target object 100 is pressurized via the intervening pad 24, as illustrated in FIG. 1C, the intervening pad 24 deforms and wraps around side portions of the electronic component 112 and the adhesive 114. In addition, the pressurizing force of the upper mold 20 is transmitted, via the intervening pad 24, not only to the upper portions of the electronic component 112 and the adhesive 114 but also to the side portions thereof.

After the adhesive 114 has hardened, in order to prevent warping of the target object 100 that may be caused by the difference in thermal expansion between front and rear surfaces, the target object 100 is cooled while the target object 100 is held in the pressurized state. Then, when the temperature of the target object 100 decreases down to a level at which taking out is feasible, the pressurization is ceased and the target object 100 is taken out from the mold.

Figure 2:
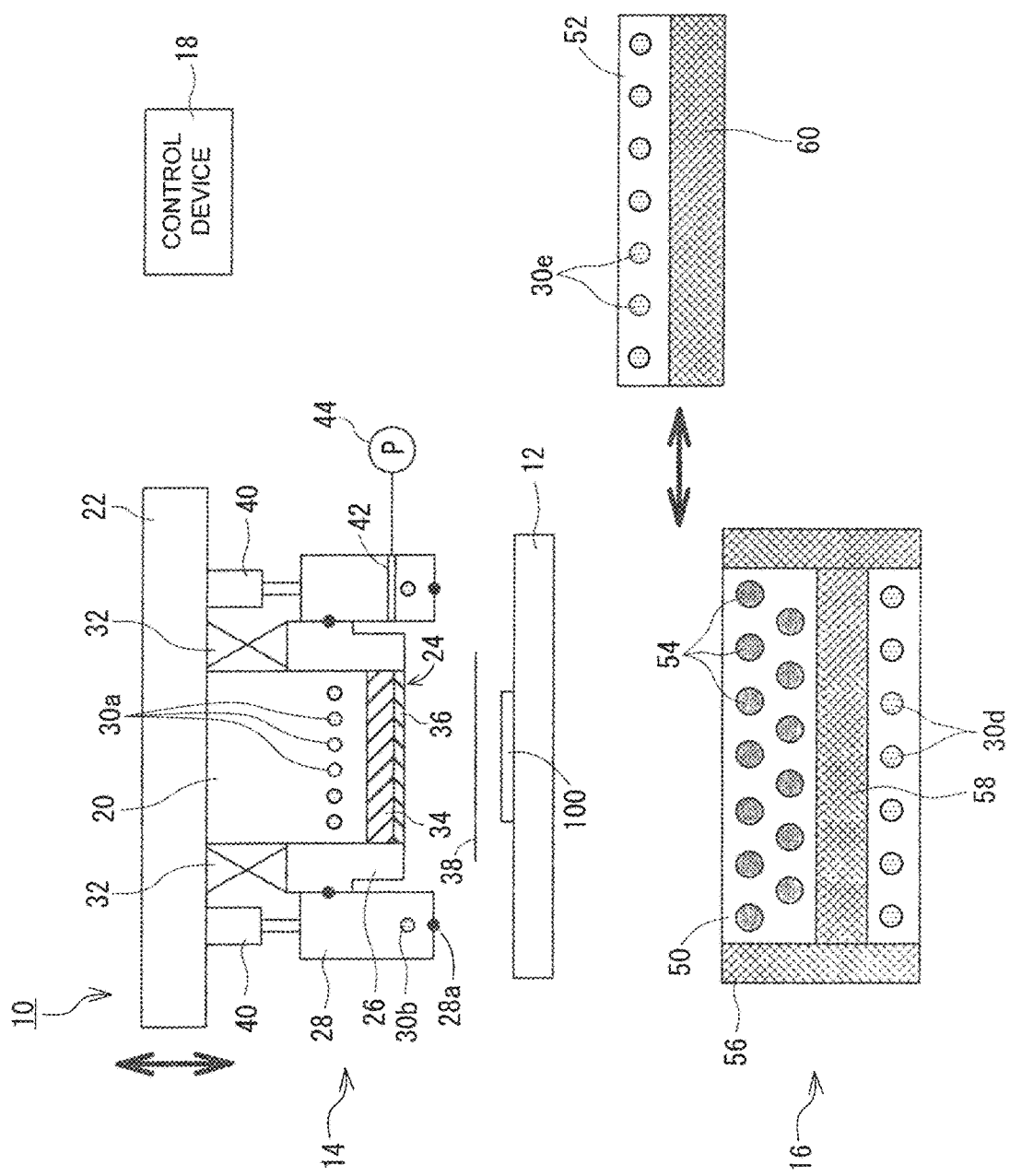
FIG. 2 is a view illustrating a configuration of the pressurizing apparatus according to the present embodiment.

Next, the pressurizing apparatus 10 that can realize the above-mentioned pressurization will be described. FIG. 2 is a view illustrating a configuration of the pressurizing apparatus 10 according to the present embodiment. The pressurizing apparatus 10 includes a mounting base 12 on which the target object 100 is mounted, an upper unit 14 disposed on an upper side of the mounting base 12, a lower unit 16 disposed on a lower side of the mounting base 12, and a control device 18 capable of controlling the driving of these elements.

The mounting base 12 is a base on which the target object 100 is mounted. No particular limitation is imposed on the configuration of the mounting base 12, so long as it can withstand pressurizing forces to be applied from the upper unit 14 and the lower unit 16 and heat to be added from a heating lower mold 50 described below. However, in order to shorten the processing time, the mounting base 12 is desirably made of a high heat transfer material that can quickly transmit the heat from the heating lower mold 50. As the high heat transfer material, for example, STC (registered trademark, 630 W/mK) that is made of copper (400 W/mK) or an alloy containing copper, manufactured by Moriya Cutlery Laboratory, Ltd., or COMPOROID (trade name, 1700 W/mK) manufactured by Thermo Graphitics Co., Ltd., is employable.

Further, as will be described in detail below, in the present embodiment, the target object 100 is kept in a vacuum state. The mounting base 12 desirably has sufficient strength to withstand the thrust by vacuum, and desirably has a thickness of 5 mm or more, more desirably 8 mm or more, further desirably 10 mm or more. However, if the thickness is excessively large, since the volume of the mounting base 12 and consequently the heat capacity increases, the amount of heat required for heating and the amount of cooling heat for cooling increase and the time required for heating and cooling increases. Therefore, for example, the thickness of the mounting base 12 is desirably 10 mm to 20 mm, so that the strength capable of withstanding the thrust by vacuum while suppressing the heat capacity can be obtained.

The upper unit 14 is disposed on the upper side of the mounting base 12, and includes a base member 22, the upper mold 20 pressurizing the target object 100, the intervening pad 24 intervening between the upper mold 20 and the target object 100, a frame body 26 supporting the intervening pad 24, and a side mold 28 that forms a hermetically closed space when closely contacting with the mounting base 12.

The base member 22 can be raised and lowered by an elevating mechanism (not illustrated). Raising and lowering the base member 22 can raise and lower the upper mold 20, the side mold 28, and the frame body 26. The control device 18 controls the raising and lowering of the base member 22. The upper mold 20 is a mold for pressurizing the target object 100 from the upper side, and is disposed directly above the target object 100. The upper mold 20 is fixed to the base member 22, and moves up and down together with the base member 22. A refrigerant flow channel 30a in which the refrigerant can flow is formed inside the upper mold 20. A cooling apparatus (not illustrated) circulates the refrigerant so as to pass through the refrigerant flow channel 30a. More specifically, the cooling apparatus supplies the refrigerant to the refrigerant flow channel 30a. The refrigerant, when flowing in the refrigerant flow channel 30a, absorbs heat from the upper mold 20 and, accordingly, its temperature increases. The cooling apparatus collects and cools the refrigerant discharged from the refrigerant flow channel 30a and sends the cooled refrigerant to the refrigerant flow channel 30a again. As apparent from FIG. 2, the upper mold 20 is provided with no heating means. Therefore, no heating is performed and only the cooling is performed for the upper mold 20.

The frame body 26 supporting the intervening pad 24 is provided around the upper mold 20. The frame body 26 is attached to the base member 22 via a spring member 32, and can be slightly raised and lowered with respect to the upper mold 20. The intervening pad 24 is an elastic body intervening between the target object 100 and the upper mold 20, and includes a soft layer 34 flexibly deformable according to the shape of the target object 100 and a heat insulation layer 36 intervening between the soft layer 34 and the target object 100. The soft layer 34 is for uniformly transmitting the pressure of the upper mold 20, and is made of a flexible material such as rubber. The soft layer 34 may be configured to have a single-layer structure or a multiple-layer structure. For example, the soft layer 34 may have a two-layer structure including a fluid soft layer made of a material excellent in fluidity and lower in modulus of repulsion elasticity, and a porous soft layer made of a porous material such as silicon sponge, fluoro sponge, or the like. As the material of the fluid soft layer, for example, high damping heat conduction gel sheet "αGEL (trademark)" manufactured by Geltec Co., Ltd., thermoplastic elastomer manufactured by Riken Technos Corporation, ultra-soft elastomer "Frengel (trade name)" manufactured by Kinugawa Rubber Industrial Co., Ltd., or the like is employable.

The heat insulation layer 36 is a layer intervening between the target object 100 and the soft layer 34 and is capable of preventing transmission of heat from the target object 100 to the soft layer 34. The heat insulation layer 36 is made of, for example, a fiber material including a low thermal conductive material such as glass wool, ceramic wool, heat-resistant felt, or the like. The heat insulation layer 36 is desirably thick enough to assure heat insulation. On the other hand, in order to uniformly transmit the pressure from the upper mold 20 to the target object 100, the heat insulation layer 36 is required to have flexibility to deform according to the shape of the target object 100 and therefore it cannot have excessive thickness. Therefore, the thickness of the heat insulation layer 36 is a thickness satisfying both the heat insulation and the flexibility; for example, approximately 2 mm to 10 mm, desirably 3 mm to 6 mm.

If the heat insulation layer 36 is brought into direct contact with the target object 100, the heat insulation layer 36 will adhere to the target object 100 and separating them from each other will become difficult. Therefore, when pressurizing the target object 100, an intermediate sheet 38 for prevention of mutual adhesion is further disposed between the heat insulation layer 36 and the target object 100. The intermediate sheet 38 is a thin sheet-like member having flexibility and is made of, for example, fluororesin such as polytetrafluoroethylene (PTFE), polyimide, or the like. The intermediate sheet 38 is generally discarded and replaced every time it is used once or several times.

The side mold 28 is disposed around the upper mold 20 and is attached to the base member 22 via an air cylinder 40. Bringing the side mold 28 into close contact with an upper surface of the mounting base 12 can form a hermetically closed space surrounded by the side mold 28, the mounting base 12, the upper mold 20, and the frame body 26. A seal member 28a is provided on a bottom surface of the side mold 28 to form the hermetically closed space. Further, the side mold 28 can be raised and lowered with respect to the upper mold 20 by driving the air cylinder 40. A refrigerant flow channel 30b in which the refrigerant can flow is formed inside the side mold 28. The cooling apparatus circulates the refrigerant so as to pass through the refrigerant flow channel 30b, so that the side mold 28 can be cooled.

A suction hole 42 is further formed in the side mold 28 so as to penetrate in the horizontal direction. The suction hole 42 communicates with a suction pump 44. Driving the suction pump 44 in the state where the side mold 28 is brought into close contact with the mounting base 12 so as to form the hermetically closed space can suck air from the hermetically closed space and bring the hermetically closed space into a vacuum state. The control device 18 controls the above-mentioned driving of the suction pump 44 and the air cylinder 40. In the present embodiment, although the side mold 28 is attached to the base member 22 via the air cylinder 40, any other configuration is employable so long as it can prohibit or permit the raising and lowering of the side mold 28 with respect to the upper mold 20. For example, a hydraulic cylinder or an electric cylinder may replace the air cylinder 40.

The lower unit 16 includes the heating lower mold 50, a cooling lower mold 52, and a switching mechanism (not illustrated). The switching mechanism is a mechanism for selectively using the heating lower mold 50 or the cooling lower mold 52 by inserting the cooling lower mold 52 on the heating lower mold 50. The heating lower mold 50 is a mold for pressurizing the target object 100 while heating it and includes a heater 54 functioning as heating means provided therein. No particular limitation is imposed on the heater 54 so long as it can heat the heating lower mold 50 to a predetermined processing temperature Tp and can withstand a specified press load Pp. In the present embodiment, used as the heater 54 is a cartridge heater that includes a heating wire (a nichrome wire) wound around a rod-like ceramic and inserted in a heat-resistant pipe so as to form a cartridge. The control device 18 controls driving of the heater 54 and maintains the heating lower mold 50 at the predetermined processing temperature Tp. The processing temperature Tp is a temperature at which the target object 100, particularly, the thermosetting adhesive 114 constituting a part of the target object 100, can be heated to a temperature higher than the curing temperature Tc of the adhesive 114. For example, when the curing temperature Tc is 150 to 200 degrees, the processing temperature Tp is set to a temperature of, e.g., 300 degrees, which is sufficiently higher than the curing temperature Tc.

A first heat insulation member 56 is provided around the heating lower mold 50, so that leakage of heat from the heater 54 to the side can be prevented. In addition, a second heat insulation member 58 is provided at a lower side of the heater 54, so that leakage of heat from the heater 54 to the lower side can be prevented. The second heat insulation member 58 vertically partitions the heating lower mold 50. A refrigerant flow channel 30d in which the refrigerant can flow is formed under the second heat insulation member 58. The cooling apparatus circulates the refrigerant so as to pass through the refrigerant flow channel 30d.

The cooling lower mold 52 is a mold for pressurizing the target object 100 while cooling it, and a refrigerant flow channel 30e through which the refrigerant can flow is formed therein. The cooling apparatus circulates the refrigerant so as to pass through the refrigerant flow channel 30e. Further, a heat insulation member 60 is provided on a bottom surface of the cooling lower mold 52. Provision of the heat insulation member 60 can prevent heat transfer from the heating lower mold 50 when the cooling lower mold 52 is disposed directly above the heating lower mold 50.

The switching mechanism causes the cooling lower mold 52 to move according to the state of progress in processing. More specifically, the switching mechanism includes a horizontally moving mechanism for causing the cooling lower mold 52 to move horizontally. The horizontally moving mechanism causes the cooling lower mold 52 to move between a position directly above the heating lower mold 50 and a position deviated away from the heating lower mold 50 in the horizontal direction. The pressurizing apparatus 10 is provided with an elevating mechanism for raising and lowering the upper unit 14, which can lower the upper unit 14 toward the lower unit 16 and push the mounting base 12 against the heating lower mold 50 or the cooling lower mold 52 positioned on the heating lower mold 50, thereby pressurizing the target object 100. More specifically, in the present embodiment, causing the upper unit 14 to move downward in a state where the cooling lower mold 52 is positioned on the heating lower mold 50 can pressurize the target object 100 while cooling it. Further, causing the upper unit 14 to move downward in a state where the cooling lower mold 52 is not present on the heating lower mold 50 can pressurize the target object 100 while heating it. From another viewpoint, in the present embodiment, raising and lowering the upper unit 14 by the elevating mechanism can control execution/cancellation of the pressurization. Horizontally moving the cooling lower mold 52 by the horizontally moving mechanism can switch the lower mold contributing to the pressurization to the heating lower mold 50 or the cooling lower mold 52. The control device 18 controls the above-mentioned driving of the elevating mechanism and the horizontally moving mechanism.

Next, pressurization processing for the target object 100, which is performed by the pressurizing apparatus 10, will be described with reference to FIGS. 3 to 7. When pressurizing the target object 100, the heater 54 heats the heating lower mold 50 beforehand until its temperature reaches the predetermined processing temperature Tp. In addition, the upper mold 20, the side mold 28, and the cooling lower mold 52 are cooled beforehand using the refrigerant, so that they are kept, for example, at room temperature, namely a temperature sufficiently lower than the glass transition temperature Tg of the adhesive 114 provided on the target object 100.

Figure 3:
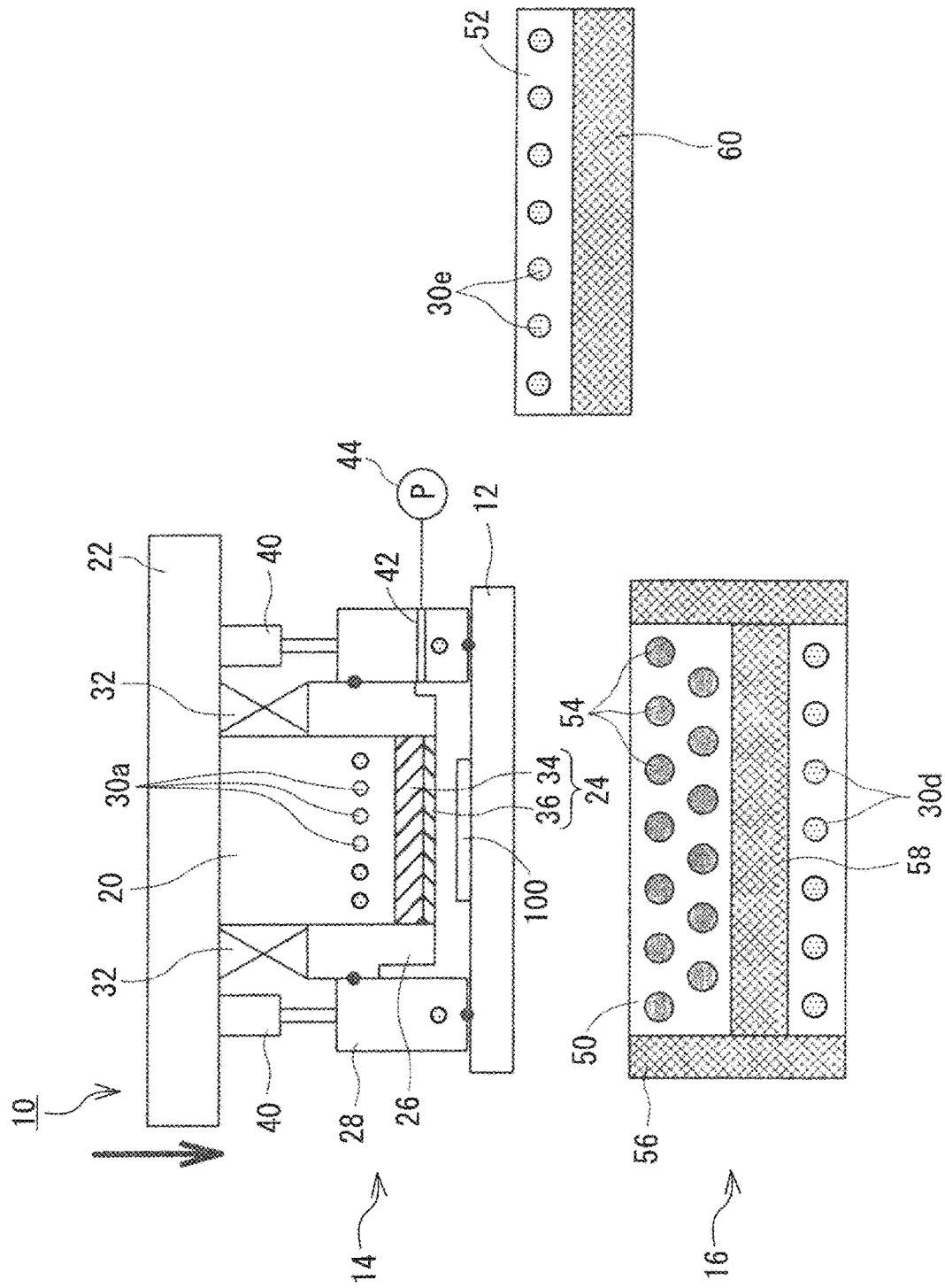
FIG. 3 is a view illustrating a process of pressurizing processing performed by the pressurizing apparatus.
Figure 4:
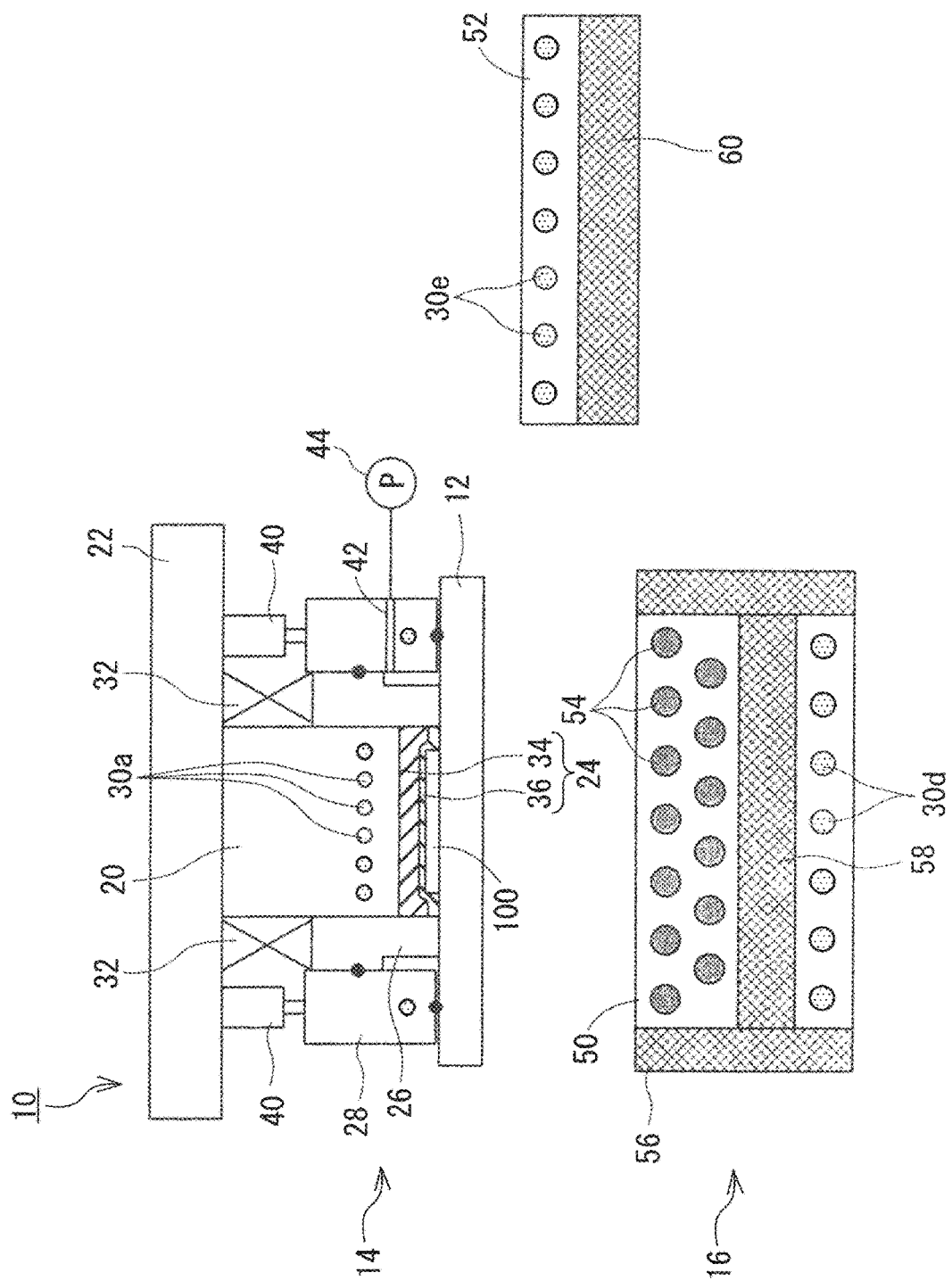
FIG. 4 is a view illustrating a process of the pressurizing processing performed by the pressurizing apparatus.

When the mounting base 12 on which the target object 100 is mounted is conveyed to a position directly below the upper mold 20, the control device 18 first brings the bottom surface of the side mold 28 into close contact with the mounting base 12 by lowering the upper unit 14 or raising the mounting base 12, as illustrated in FIG. 3. In this case, in order to prevent the upper mold 20 and the intervening pad 24 from contacting with the target object 100, the control device 18 causes the air cylinder 40 to extend by applying air pressure, thereby bringing the side mold 28 into a state where it protrudes downward in relation to the upper mold 20 or the like. Further, in this case, each of the heating lower mold 50 and the cooling lower mold 52 is apart from the mounting base 12. Accordingly, in this state, no pressurizing force is applied to the target object 100.

Bringing the bottom surface of the side mold 28 into close contact with the mounting base 12 can form a hermetically closed space surrounded by the side mold 28, the upper mold 20, the frame body 26, and the mounting base 12. In this state, the control device 18 drives the suction pump 44 to suck air from the hermetically closed space and bring the hermetically closed space into a vacuum state. As a result, air around the target object 100 can be removed. Removing air from the surrounding of the adhesive 114 before the adhesive 114 softens can effectively prevent air biting by which air enters the inside of the softened adhesive 114.

When the vacuum suction of the hermetically closed space is completed, the control device 18 depressurizes the air cylinder 40 so that the air cylinder 40 can contract. When the air cylinder 40 is brought into a contractable state, the vacuum pressure (the pressure difference between the hermetically closed space and the external space) causes the upper mold 20 and the side mold 28 to relatively move toward the mounting base 12 and the target object 100. Finally, the intervening pad 24 comes into contact with the target object 100, and the target object 100 is preliminarily pressurized by a load Pb corresponding to the vacuum pressure. The load Pb in the preliminary pressurization is sufficiently lower than the press load Pp given in a below-described main pressurization. Further, as is apparent from the above explanation and FIG. 4, this preliminary pressurization is performed in a state where the mounting base 12 and the heating lower mold 50 are apart from each other. In other words, the preliminary pressurization is performed in a state where the target object 100 is not heated and the adhesive 114 is not yet softened. Performing the preliminary pressurization enables the intervening pad 24 to deform according to the surface shape of the target object 100 and wrap around the target object 100, particularly, around the adhesive 114 not yet been softened, thereby holding the target object 100.

Figure 5:
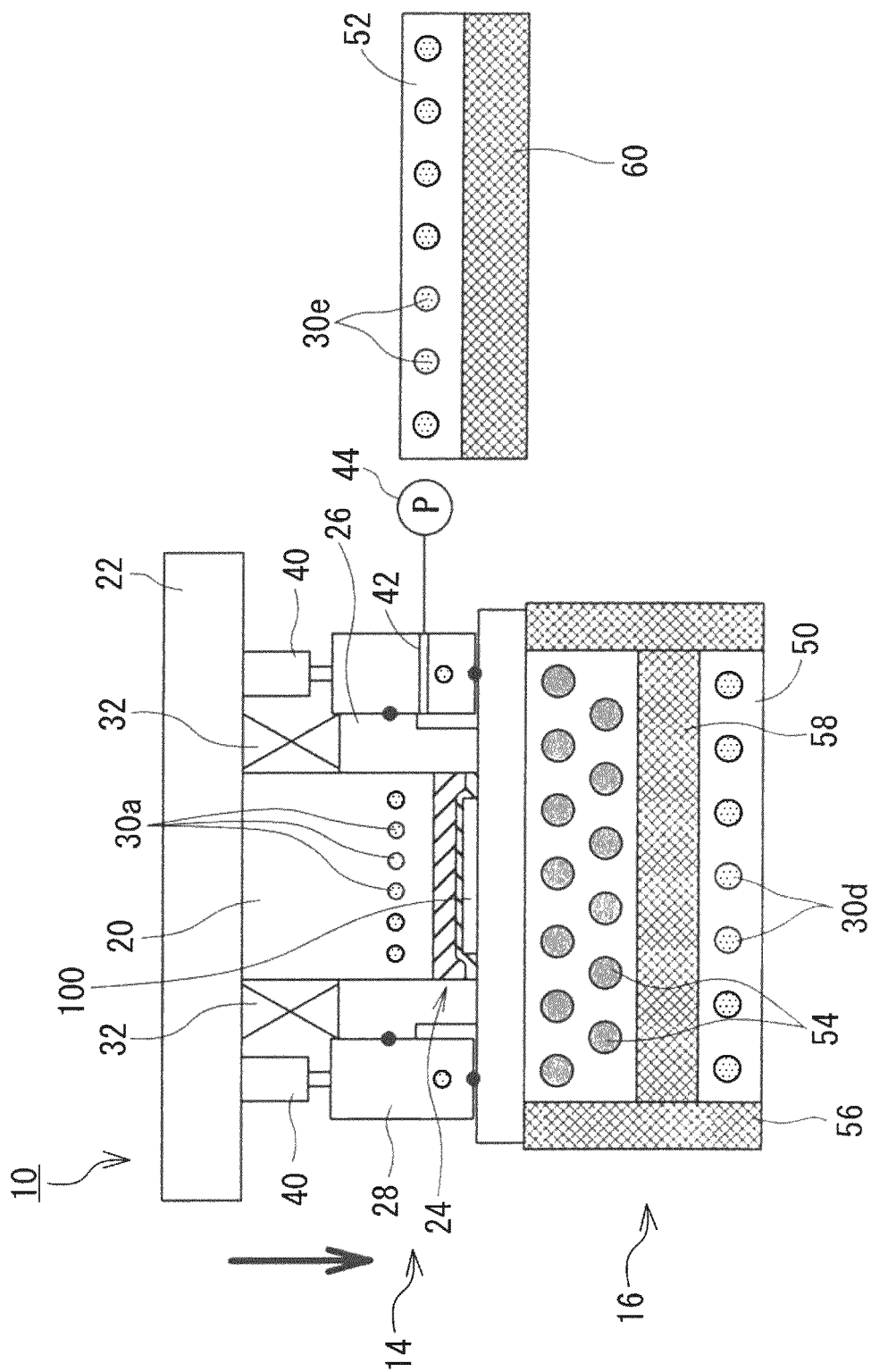
FIG. 5 is a view illustrating a process of the pressurizing processing performed by the pressurizing apparatus.

After the intervening pad 24 is brought into close contact with the target object 100 by the preliminary pressurization, the control device 18 performs main pressurization in which the upper unit 14 is lowered together with the vacuum-sucked mounting base 12 and the mounting base 12 is pressed by the heating lower mold 50 from the lower side thereof, as illustrated in FIG. 5. In the main pressurization, the target object 100 is sandwiched between the upper mold 20 and the heating lower mold 50 and pressurized with the specified press load Pp. As mentioned above, the heating lower mold 50 is heated beforehand to the predetermined processing temperature Tp. Heat of the heating lower mold 50 is transferred to the target object 100 via the mounting base 12 having excellent heat transfer property. More specifically, in the main pressurization, the target object 100 is heated to the specified processing temperature Tp while being pressurized with the specified press load Pp. Performing the main pressurization for a predetermined time causes the thermosetting adhesive 114 provided in the target object 100 to soften upon reaching the glass transition temperature Tg and subsequently harden upon reaching the curing temperature Tc. As a result, the electronic component 112 and the substrate 110 are bonded to each other. In this case, the heat of the heating lower mold 50 is also transferred to the intervening pad 24 via the mounting base 12 and the target object 100. However, since the heat insulation layer 36 is provided at a lower side of the intervening pad 24, the heat is not easily transferred to the soft layer 34 and therefore there can be prevented heating to an excessively high temperature the soft layer 34 and the upper mold 20 positioned thereon.

Figure 6:
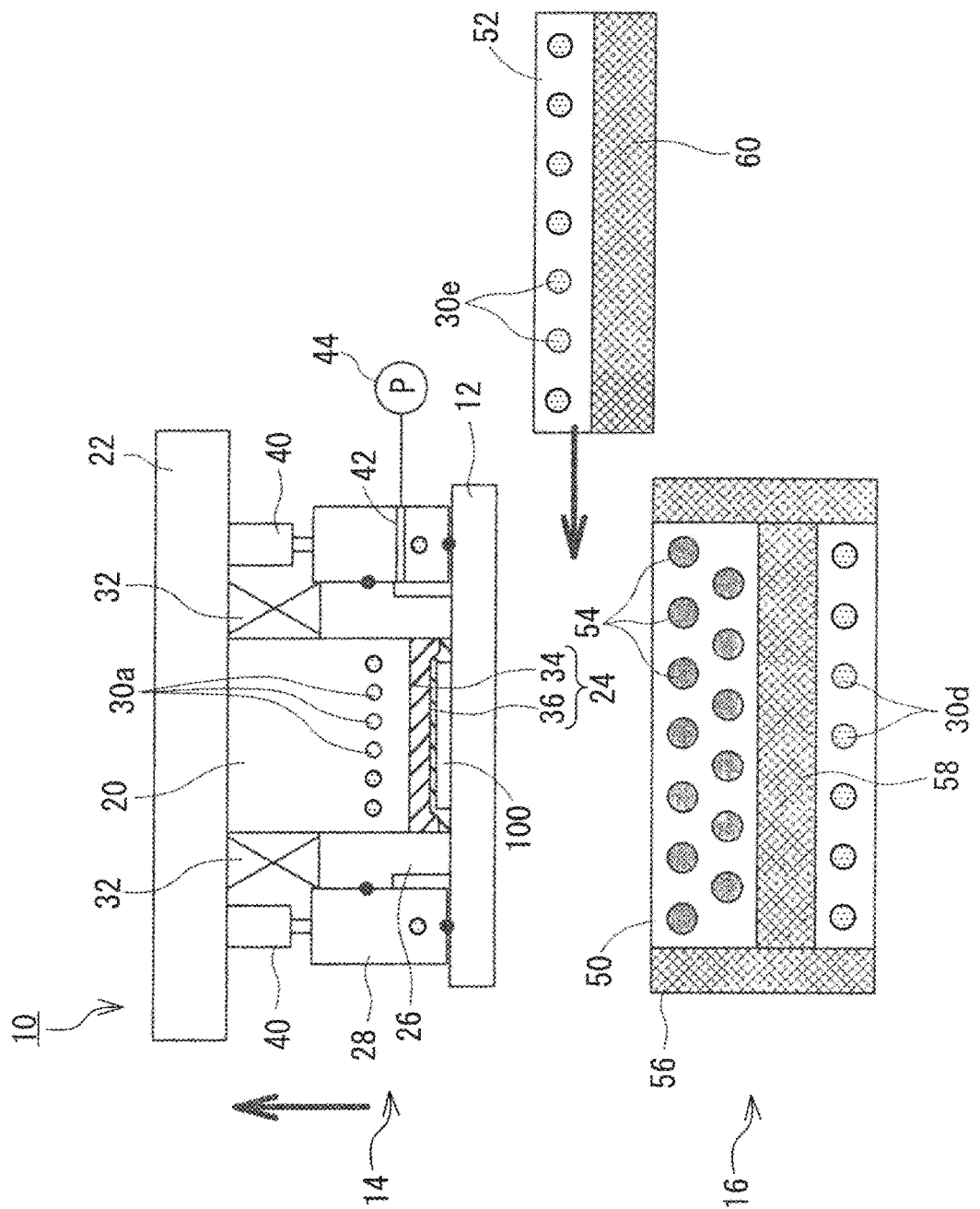
FIG. 6 is a view illustrating a process of the pressurizing processing performed by the pressurizing apparatus.
Figure 7:
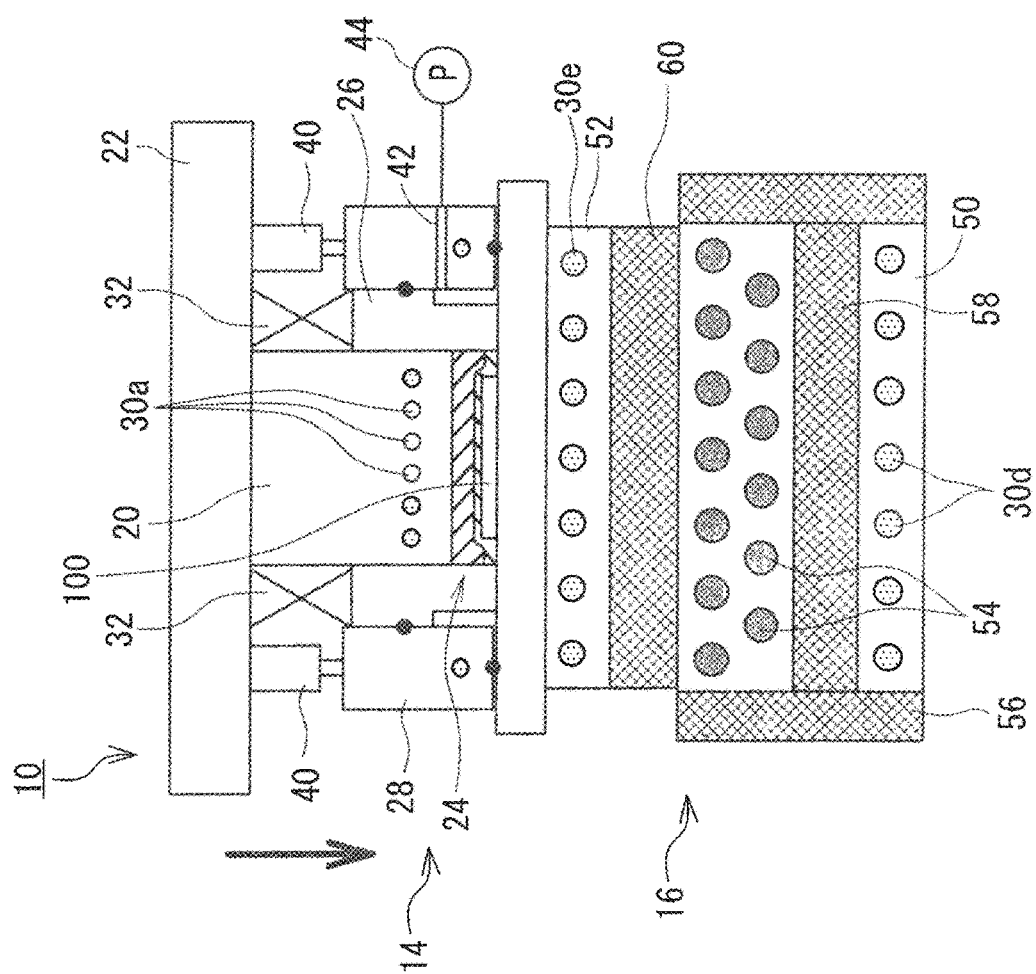
FIG. 7 is a view illustrating a process of the pressurizing processing performed by the pressurizing apparatus.

If the main pressurization has been performed for a sufficient time, then the control device 18 raises the upper unit 14, as illustrated in FIG. 6, to separate the heating lower mold 50 from the mounting base 12. If a sufficient space is formed between the heating lower mold 50 and the mounting base 12, then the control device 18 places the cooling lower mold 52 between the mounting base 12 and the heating lower mold 50, as illustrated in FIG. 7. Then, in this state, the control device 18 lowers the upper unit 14 together with the mounting base 12 and pressurizes the target object 100 with a specified cooling-time load Pc. In this case, since the cooling lower mold 52 is cooled beforehand with the refrigerant, the target object 100 can be quickly cooled. During the cooling period, since the target object 100 is sandwiched and pressurized between the cooling lower mold 52 and the upper mold 20, warpage or the like that may be caused due to the difference in thermal expansion can be effectively prevented. The cooling-time load Pc may be smaller than the press load Pp, so long as it is sufficient to prevent deformation of the target object 100. If the target object 100 is cooled to a temperature suitable for removal (e.g., room temperature), then the control device 18 raises the upper unit 14 together with the mounting base 12 to cease the pressurization. In addition, the control device 18 causes the air cylinder 40 to extend by applying the pressure to the air cylinder 40 so as to raise the upper mold 20, thereby separating the intervening pad 24 from the target object 100. Further, the suction hole 42 is released to the atmosphere, and the hermetically closed space is brought to the atmospheric pressure. Finally, the control device 18 further raises the upper unit 14 to separate the upper mold 20 unit from the mounting base 12, and then conveys the mounting base 12 to a predetermined unloading position (not illustrated).

Figure 8:
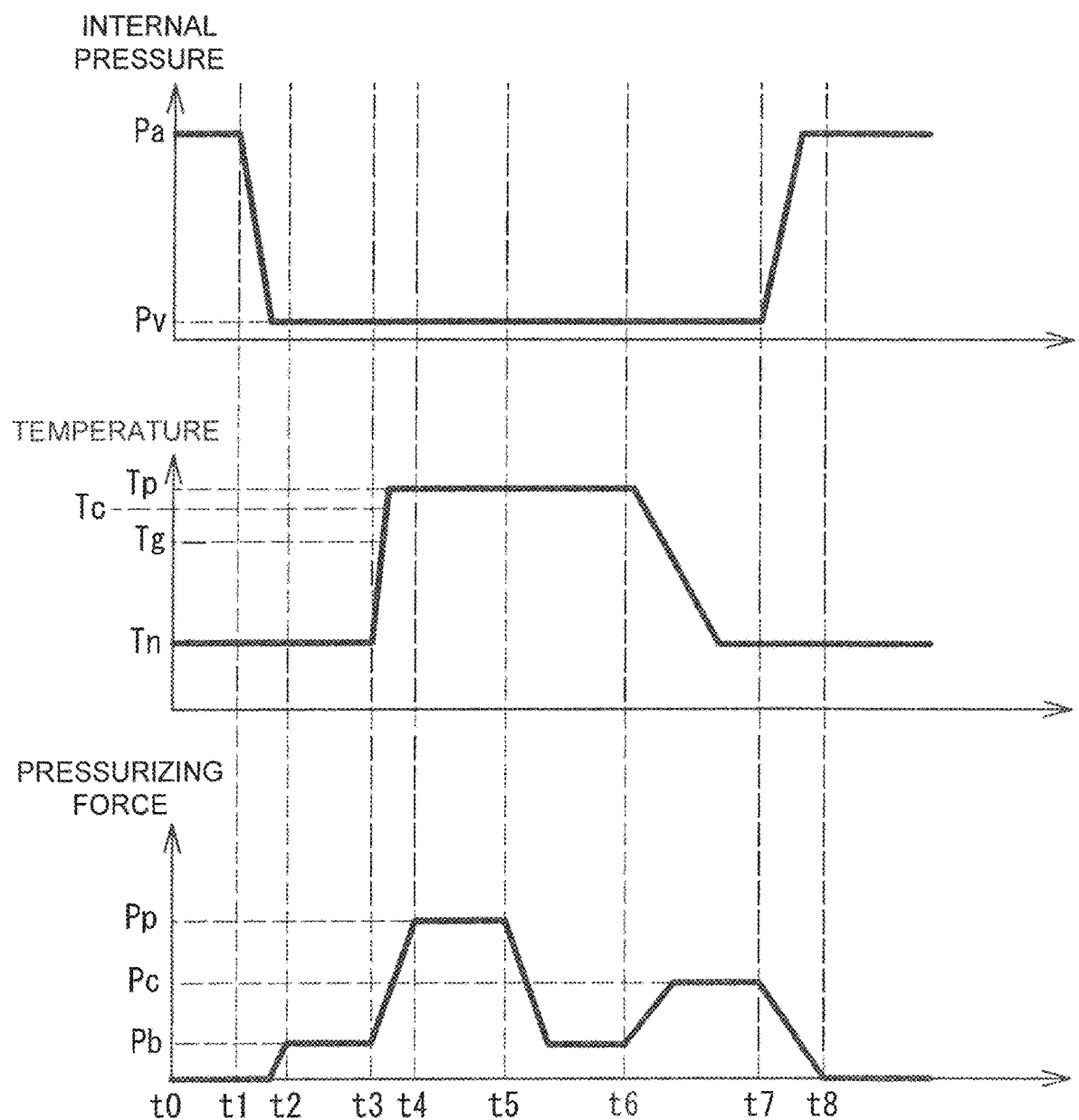
FIG. 8 is a graph illustrating an example of changes in pressure of an environment surrounding an target object during the pressurizing processing, temperature of the target object, and load applied to the target object.

FIG. 8 is a graph illustrating an example of changes in pressure of an environment surrounding the target object 100 during pressurizing processing, temperature of the target object 100, and load applied to the target object 100. As apparent from the foregoing description, at the time of starting the pressurizing processing (time t0), the pressure in the environment surrounding the target object 100 is atmospheric pressure Pa. Further, since the heating or pressurization of the target object 100 is not yet started at time t0, the temperature of the target object 100 is room temperature Tn and the pressurizing force is zero.

Subsequently, the vacuum suction is started at time t1. When the air cylinder 40 is depressurized after the vacuum suction has been completed, at time t2, the load Pb according to the vacuum pressure Pv is applied to the target object 100 for the purpose of preliminary pressurization. Then, at time t3, the main pressurization is started to cause the heating lower mold 50 having been already heated to press the mounting base 12. After starting the main pressurization, the temperature of the target object 100 rises quickly and reaches the specified processing temperature Tp in a relatively short time. The processing temperature Tp is higher than the glass transition temperature Tg of the adhesive 114 provided in the target object 100 and the curing temperature Tc of the adhesive. Accordingly, in the process of reaching the processing temperature Tp, the target object 100 softens upon reaching the glass transition temperature Tg and subsequently hardens upon reaching the curing temperature Tc.

Further, by pressing with the heating lower mold 50, at time t4, the target object 100 is pressurized with the predetermined press load Pp. The press load Pp is large enough to obtain electrical conduction between the bump 113 of the electronic component 112 and the wiring of the substrate 110 and is, for example, 20 tons. Subsequently, at time t5, the main pressurization is terminated. More specifically, at time t5, the control device 18 raises the upper unit 14 to cease the pressurization of the target object 100.

When the upper unit 14 is raised, the pressurizing force applied to the target object 100 quickly decreases. On the other hand, if the cooling is natural cooling, the temperature of the target object 100 hardly decreases and accordingly the target object 100 remains at the processing temperature Tp. Therefore, in order to cool the target object 100, the control device 18 replaces the heating lower mold 50 with the cooling lower mold 52 to press and cool the target object 100. When the cooling lower mold 52 comes into contact with the mounting base 12 at time t6, the temperature of the target object 100 quickly decreases. In addition, lowering the upper unit 14 can increase the pressurizing force applied to the target object 100 and can effectively prevent deformation such as warpage of the target object 100. The cooling-time load Pc applied in this case is, for example, approximately 10 tons.

When the target object 100 has been cooled to room temperature, then the control device 18 raises the upper unit 14 to cease the pressurization of the target object 100. Subsequently, the surroundings of the target object 100 are released to atmospheric pressure. When the surroundings of the target object 100 return to atmospheric pressure at time t8, the control device 18 separates the upper unit 14 from the target object 100 and conveys to a discharge position the mounting base 12 carrying the target object 100.

As apparent from the foregoing description, in the present embodiment, the lower mold contributing to the pressurization of the target object 100 is switched between the preheated heating lower mold 50 and the precooled cooling lower mold 52. The reason why such a configuration is employed will be described below in comparison with the prior art.

Even in the conventional pressurizing apparatus 10, the target object 100 is sandwiched between the upper mold 20 and the lower mold and, if necessary, the target object 100 is heated and cooled. In the conventional heating apparatus, in order to heat and cool the target object 100, both heating means and cooling means are provided in the lower mold, and the lower mold is heated and cooled if necessary. In this case, it takes a time to heat the cooled lower mold to the predetermined processing temperature Tp and a time to cool the heated lower mold to a predetermined cooling temperature. As a result, in the conventional pressurizing apparatus 10, the processing time is liable to become long. In particular, in the pressurizing apparatus 10, in order to withstand a higher pressure, the lower mold is required to be large in thickness and large in heat capacity. Heating and cooling such a large lower mold takes a long time.

Needless to say, using a heater having higher heating capacity can reduce the time required for heating. However, such a heater is expensive and the cost increases. Further, when attempting to heat the lower mold having once been cooled to a heating temperature in a short time, overshoot exceeding a desired processing temperature Tp may occur in the process of temperature rise. As a result, even if it is temporary, there is a possibility that the target object 100 is heated excessively.

In the present embodiment, as mentioned above, the preheated heating lower mold 50 and the precooled cooling lower mold 52 are switched according to the state of progress in processing. As a result, the time for heating or cooling the lower mold is not required and the target object 100 can be heated and cooled quickly. More specifically, as already described with reference to FIG. 8, in the present embodiment, bringing the heating lower mold 50 into contact with the mounting base 12 can quickly increase the temperature of the target object 100 (before and after time t3 in FIG. 8), and bringing the cooling lower mold 52 into contact with the mounting base 12 can quickly decrease the temperature of the target object 100 (before and after time t6 in FIG. 8). In other words, according to the present embodiment, there is no requirement to take a time to heat and cool the lower mold to a desired temperature. As a result, the time required for the pressurizing processing can be greatly reduced.

In addition, separately using the heating lower mold and the cooling lower mold can reduce energy loss and can reduce generation of vapor. More specifically, according to the conventional pressurizing apparatus 10 that heats and cools a single lower mold, it is necessary to heat and cool the lower mold having large heat capacity and accordingly the energy loss is large. Further, when attempting to cool the once heated lower mold with a liquid such as water serving as refrigerant, the liquid will be vaporized and the pressure in the refrigerant flow channel increases. In order to prevent such problems, it is necessary to supply cooling air before supplying the liquid or additionally provide a buffer for temporarily storing and cooling vapor generated after the liquid has once been supplied, resulting in a complicated configuration. In the present embodiment, since it is unnecessary to cause the refrigerant to flow inside a high-temperature member, no vapor is generated and the configuration can be simplified.

Further, in the present embodiment, the target object 100 is heated only from the lower side thereof and is not heated from the upper side thereof. In other words, in the present embodiment, the upper mold 20 is provided with no heating means. As a result, the target object 100 can be heated to a higher temperature than before, without increasing the temperature of the intervening pad 24.

More specifically, in order to realize quick heating, there was a case where the conventional pressurizing apparatus 10 was provided with heating means not only for the lower mold but also for the upper mold 20. In this case, while the target object 100 can be quickly heated, the intervening pad 24 intervening between the upper mold 20 and the target object 100 is also heated. Although the intervening pad 24 according to the present embodiment includes the heat insulation layer 36, the conventional intervening pad 24 does not include the heat insulation layer 36 and is mainly constituted by a soft layer containing silicone-based organic substance as a main component. The heatproof temperature of such a soft layer 34 is often less than 200 degrees. On the other hand, in recent years, the curing temperature Tc of the adhesive 114 provided in the target object 100 is likely to be higher and in a range from 150 degrees to 300 degrees. More specifically, in order to harden the adhesive 114 to bond the electronic component 112 to the substrate 110, it is necessary to heat the target object 100 up to 150 degrees to 300 degrees.

When attempting to heat the target object 100 up to 150 degrees to 300 degrees with the heating means provided in the upper mold 20, the intervening pad 24 (the soft layer 34) provided between the upper mold 20 and the target object 100 is also heated. In this case, the intervening pad 24 is liable to be broken when the temperature exceeds the heatproof temperature. More specifically, according to the conventional pressurizing apparatus 10 provided with the heating means for the upper mold 20, there was a possibility of causing breakage of the intervening pad 24. Therefore, it was difficult for the conventional pressurizing apparatus 10 provided with the heating means for the upper mold 20 to heat the target object 100 to a temperature higher than the heatproof temperature of the intervening pad 24 (the soft layer 34).

On the other hand, in the present embodiment, as mentioned above, the heating means is provided only in the heating lower mold 50 and no heating means is provided in the upper mold 20. Accordingly, the soft layer 34 having low heat resistance is not heated by the upper mold 20. Further, in the present embodiment, the heat insulation layer 36 is provided between the soft layer 34 having low heat resistance and the target object 100 to be heated to high temperature. In addition, the upper mold 20 is kept at a constant temperature with the refrigerant flowing in the refrigerant flow channel 30a. As a result, heat transfer to the soft layer 34 can be effectively prevented, and temperature rise of the soft layer 34, and consequently thermal damage, can be effectively prevented. From another viewpoint, according to the present embodiment, the target object 100 can be heated to a temperature higher than the heatproof temperature of the soft layer 34, and the range of the target object 100 that can be handled expands.

Further, as apparent from the foregoing description, in the present embodiment, prior to the heating of the target object 100, the vacuum suction is applied to the surrounding environment of the target object 100. As a result, the air biting by which air resides in the adhesive 114 after completing the heating and pressurization can be prevented. In this case, the vacuum suction is desirably performed before the adhesive melts; namely, before the adhesive 114 reaches the glass transition temperature Tg. According to the conventional pressurizing apparatus 10 including the heating means provided for the upper mold 20, since the high-temperature upper mold 20 comes close to the target object 100 when the vacuum suction is performed, there is a problem that the adhesive 114 melts and the air cannot be appropriately removed. Needless to say, if the heating of the upper mold 20 is stopped during the vacuum suction, such a problem will not arise. However, in this case, it is necessary to heat the upper mold 20 after the vacuum suction and another problem will arise in that the time required for the processing becomes longer.

Further, in the present embodiment, before heating the target object 100 after the vacuum suction, the preliminary pressurization is performed for pressurizing the target object 100 with the upper mold 20 and the intervening pad 24 at the preload Pb lower than the press load Pp. By performing the preliminary pressurization prior to the heating, the target object 100 can be held by the intervening pad 24. As a result, even when the adhesive 114 melts, movement of the electronic component 112 can be restricted by the intervening pad 24 and deviation of the electronic component 112 can be effectively prevented. More specifically, in the conventional pressurizing apparatus 10, the pressurization and heating of the target object 100 was performed without performing the preliminary pressurization. Therefore, the adhesive 114 is liable to reach the glass transition temperature Tg and soften before the target object 100 is sufficiently held by the intervening pad 24. If the adhesive 114 softens in the state where the adhesive 114 is not held by the intervening pad 24, the electronic component 112 may cause position deviation or the like, since the electronic component 112 can move relatively freely. On the other hand, in the present embodiment, the target object 100 is preliminarily pressurized by the upper mold 20 and the intervening pad 24 that are not heated, the target object 100 is held by the intervening pad 24, and then the heating of the target object 100 is performed. Therefore, even when the adhesive softens by the heating, the movement of the electronic component 112 is restricted and the electronic component 112 can be effectively prevented from causing position deviation.

Figure 9:
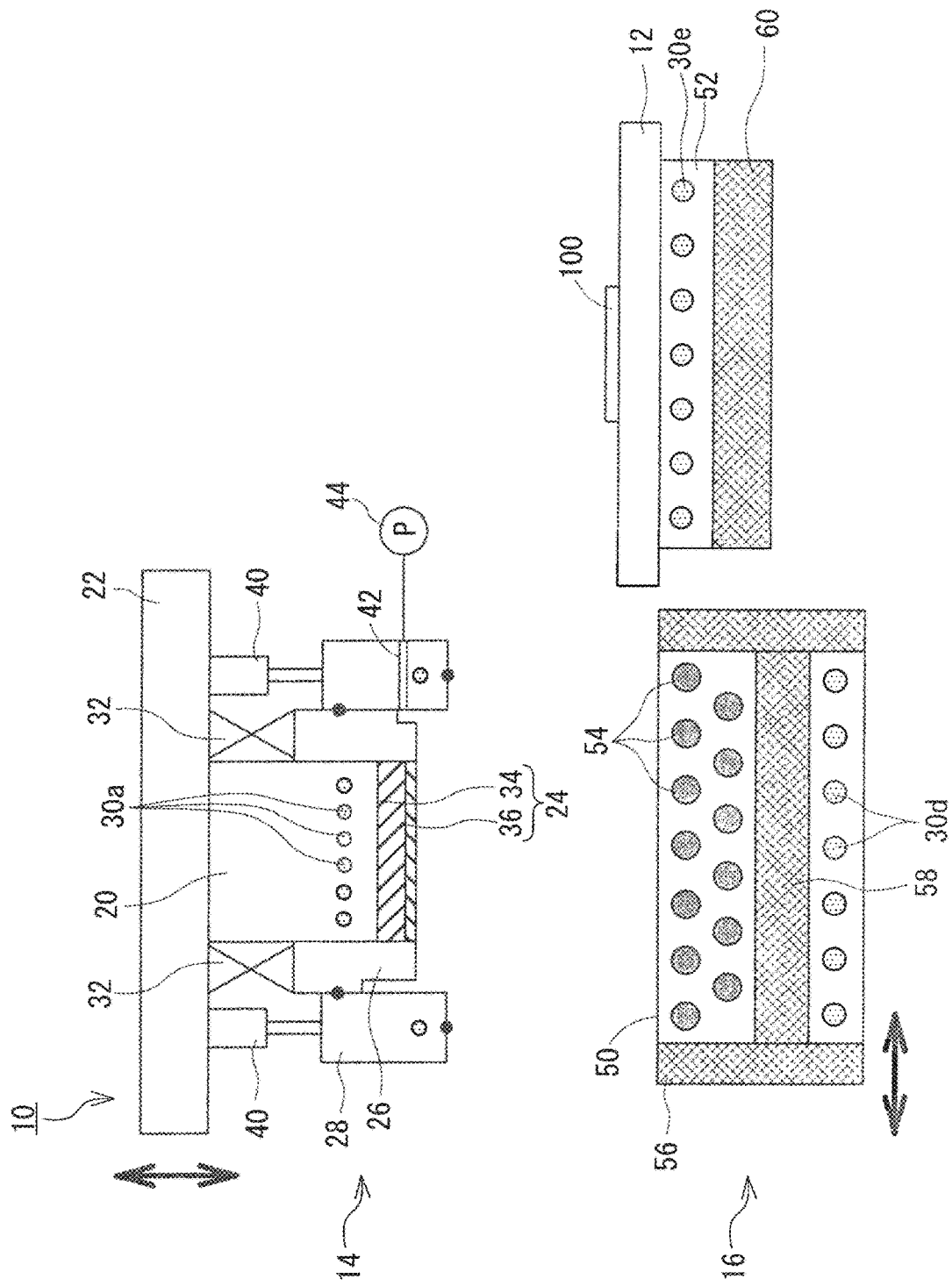
FIG. 9 is a view illustrating a process of pressurizing processing performed by a pressurizing apparatus according to a second embodiment.

Next, a second embodiment will be described with reference to FIGS. 9 to 12. FIGS. 9 to 12 are views illustrating a flow of the pressurizing processing according to the second embodiment. The second embodiment is different from the first embodiment in that both of the heating lower mold 50 and the cooling lower mold 52 are movable horizontally. FIG. 9 illustrates a starting state of the pressurizing processing according to the second embodiment. As illustrated in FIG. 9, in this case, the cooling lower mold 52 is deviated away from the upper mold 20 in the horizontal direction, and the heating lower mold 50 is positioned below the upper mold 20. In this state, the mounting base 12 on which the target object 100 is mounted is conveyed onto the cooling lower mold 52. In this case, since the cooling lower mold 52 is deviated away from the upper mold 20 in the horizontal direction, a wide space can be secured above the cooling lower mold 52, and a space for conveying the mounting base 12 (e.g., an installation space of a mechanism for conveying the mounting base 12) can be sufficiently secured.

Figure 10:
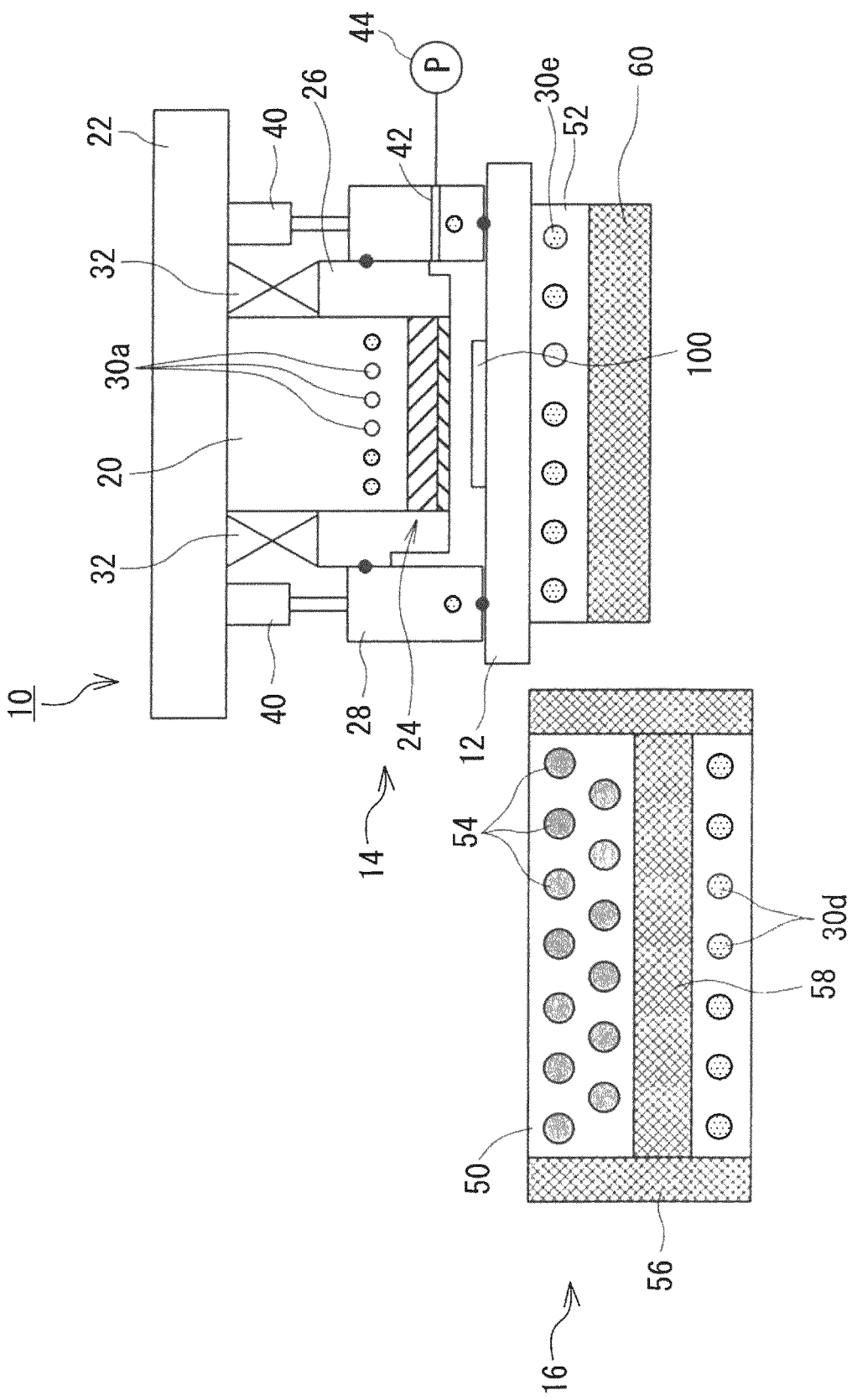
FIG. 10 is a view illustrating a process of the pressurizing processing performed by the pressurizing apparatus according to the second embodiment.
Figure 11:
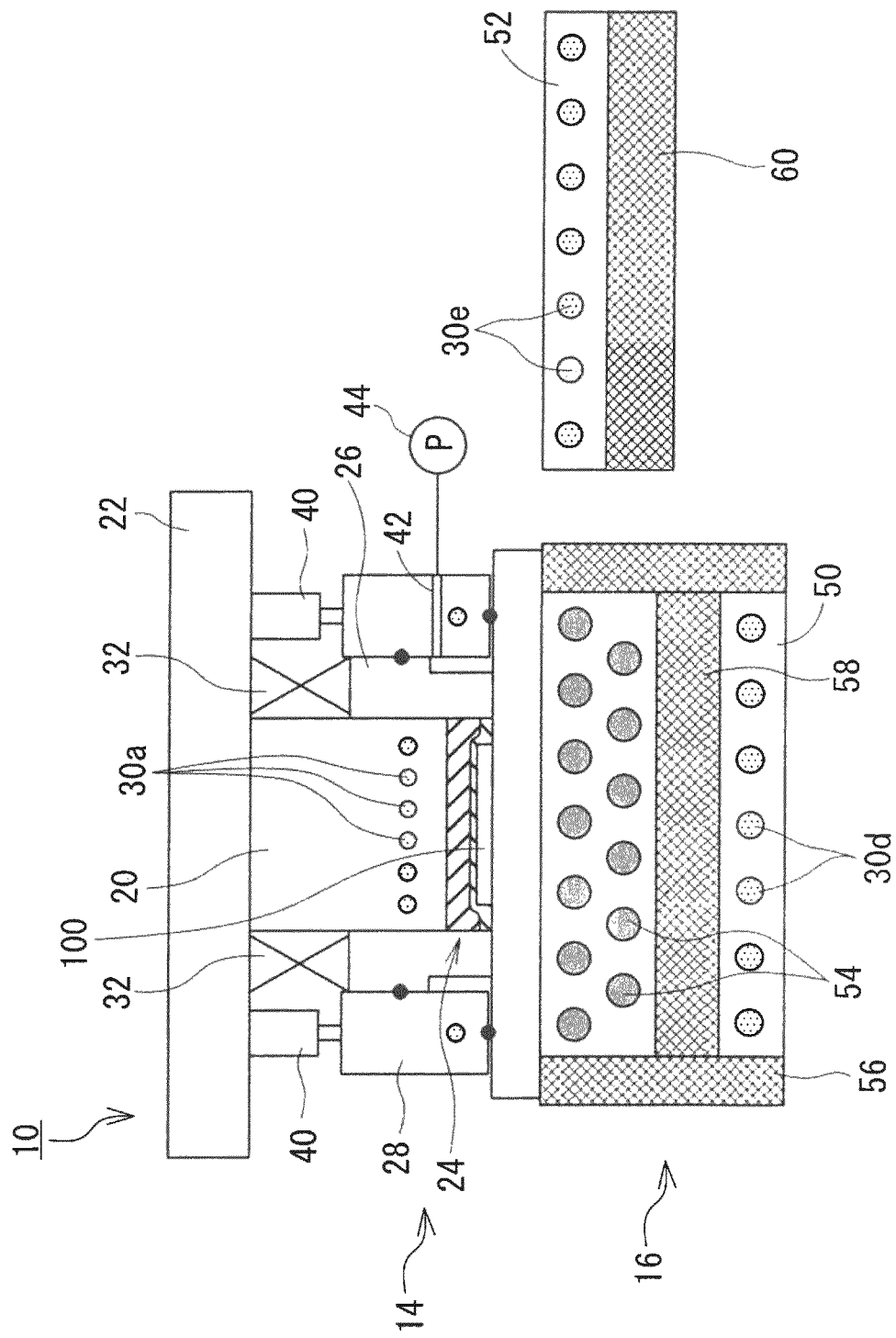
FIG. 11 is a view illustrating a process of the pressurizing processing performed by the pressurizing apparatus according to the second embodiment.
Figure 12:
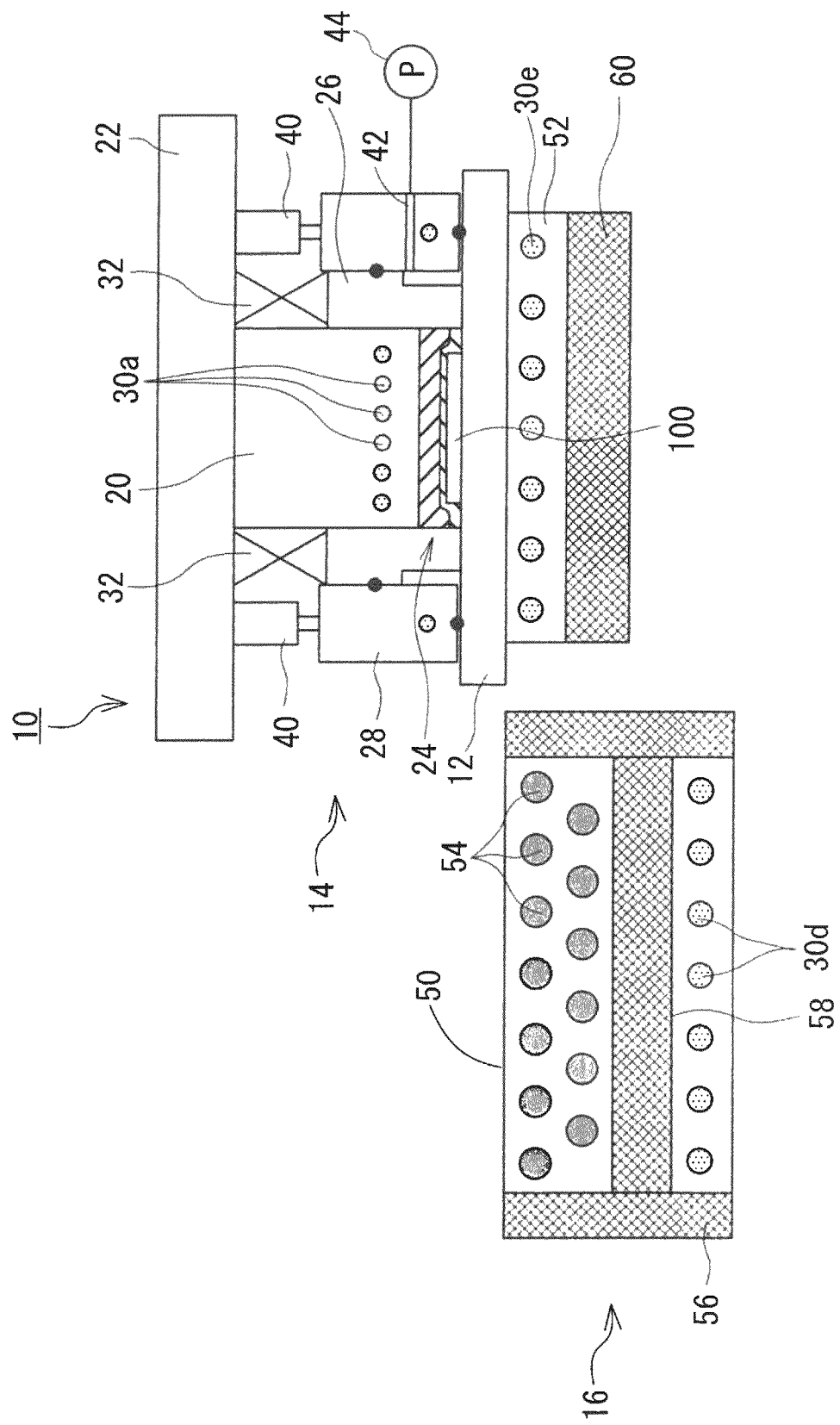
FIG. 12 is a view illustrating a process of the pressurizing processing performed by the pressurizing apparatus according to the second embodiment.

If the conveyance of the mounting base 12 onto the cooling lower mold 52 is completed, then the control device 18 causes the heating lower mold 50 to move to a position deviated away from the upper mold 20 in the horizontal direction, as illustrated in FIG. 10. At the same time, the control device 18 causes the cooling lower mold 52 to move horizontally to a position right below the upper mold 20. Subsequently, the control device 18 lowers the upper unit 14 to bring the bottom surface of the side mold 28 into close contact with the upper surface of the mounting base 12. Then, similar to the first embodiment, the control device 18 preliminarily pressurizes the target object at the preload Pb with a differential pressure available between the hermetically closed space and the external space, after vacuum sucking the hermetically closed space around the target object 100. When the preliminary pressurization is completed, the control device 18 again moves the cooling lower mold 52 to the position deviated away from the upper mold 20 in the horizontal direction and also causes the heating lower mold 50 to move to the position right below the upper mold 20. Then, as illustrated in FIG. 11, the control device 18 causes the heating lower mold 50 to press the mounting base 12 and perform the main pressurization for heating the target object 100 while pressurizing it at the specified press load Pp. When the main pressurization is completed, as illustrated in FIG. 12, the control device 18 replaces the heating lower mold 50 with the cooling lower mold 52 and causes the cooling lower mold 52 to cool the target object 100 while pressurizing it. Subsequently, when the cooling of the target object 100 is completed, the control device 18 raises the upper unit 14 to separate the upper unit 14 from the mounting base 12, and causes the cooling lower mold 52 on which the mounting base 12 is mounted to move in the horizontal direction. Subsequently, the control device 18 conveys the mounting base 12 to the predetermined discharge position.

As apparent from the foregoing description and FIGS. 10 and 12, according to the second embodiment, since the heating lower mold 50 and the cooling lower mold 52 are not aligned vertically, heat transfer between two lower molds 50 and 52 can be prevented. As a result, it is easy to keep each of the lower molds 50 and 52 at a specified temperature.

In addition, in the second embodiment, similar to the first embodiment, the time required for the heating and the cooling, and eventually the pressurizing processing time can be greatly reduced. Further, since the vacuum suction/preliminary pressurization is performed before the adhesive 114 softens, the air biting and the deviation of a component can be surely prevented.

The configuration described above is a mere example, and the remainder of the configuration can be appropriately modified as long as the lower mold contributing to the pressurizing can be switched between the heating lower mold 50 and the cooling lower mold 52. For example, in the present embodiment, although the vacuum suction and the preliminary pressurization precede the main pressurization, these may be omitted in some cases. Further, in the present embodiment, although the intervening pad 24 is provided with the soft layer 34 and the heat insulation layer 36, the heat insulation layer 36 may be omitted if the soft layer 34 can be kept below its heatproof temperature. Further, in the foregoing description, the upper unit 14 is raised and lowered to switch between execution and cancellation of the pressurization. However, instead of or in addition to the upper unit 14, the lower unit 16 may be raised and lowered to switch between execution and cancellation of the pressurization. Further, the configurations of various driving mechanisms, cooling means, and heating means may be replaced by other conventionally known configurations.

REFERENCE SIGNS LIST 10 pressurizing apparatus, 12 mounting base, 14 upper unit, 16 lower unit, 18 control device, 20 upper mold, 22 base member, 24 intervening pad, 26 frame body, 28 side mold, 30 refrigerant flow channel, 32 spring member, 34 soft layer, 36 heat insulating layer, 38 intermediate sheet, 40 air cylinder, 42 suction hole, 44 suction pump, 50 heating lower mold, 52 cooling lower mold, 54 heater, 56, 58, 60 heat insulation member, 100 target object, 110 substrate, 111 wiring, 112 electronic component, 113 bump, 114 adhesive.

The invention claimed is:
1. A pressurizing apparatus, comprising:
a mounting base on which a target object is mountable;
an upper unit including a base member, which is moveable upward and downward, and an upper mold fixed on the base member and for pressurizing the target object when the target object is mounted on the mounting base from an upper side thereof;
a heating lower mold that is a heated lower mold and is configured to heat the target object while pressurizing it in a state where the mounting base is sandwiched between the upper mold and the heating lower mold;

a cooling lower mold that is a cooled lower mold and is configured to cool the target object while pressurizing it in a state where the mounting base is sandwiched between the upper mold and the cooling lower mold;

a control device configured to control, according to a state of progress in a pressurization processing of the target object, driving of the heating lower mold and the cooling lower mold to switch the one of the heating lower mold and the cooling lower mold contributing to the pressurization of the target object; and an intervening pad configured to intervene between the upper mold and the target object, wherein the intervening pad includes:
- a deforming layer configured to flexibly deform according to a shape of the target object; and
- a heat insulating layer configured to intervene between the deforming layer and the target object and thermally insulate the target object from the deforming layer.

2. The pressurizing apparatus according to claim 1, wherein the heating lower mold is configured to heat the target object to a temperature higher than a temperature at which the deforming layer breaks.

3. The pressurizing apparatus according to claim 1, wherein the control device is configured to bring the intervening pad into contact with the target object to hold the target object by the intervening pad, and subsequently to cause the heating lower mold to heat and pressurize the target object.

4. The pressurizing apparatus according to claim 1, further comprising:
- a side mold disposed around the upper mold and, when closely contacting with the mounting base, configured to form a hermetically closed space around the target object together with the upper mold and the mounting base; and
- a suction apparatus for sucking air from the hermetically closed space to bring a surrounding of the target object into a vacuum state,
wherein the control device is configured, prior to the pressurization of the target object, to bring the side mold into contact with the mounting base to form the hermetically closed space and to drive the suction apparatus to bring the hermetically closed space into the vacuum state.

5. A pressurizing method for pressurizing and heating a target object mounted on a mounting base, the method comprising:
- a heating step of sandwiching the mounting base on which the target object is mounted between (i) an upper mold fixed on an upwardly-and-downwardly moveable base member and (ii) a heating lower mold, which is a heated lower mold, and heating the target object with heat from the heating lower mold while pressurizing the target object; and
- a cooling step of sandwiching the mounting base between the upper mold and a cooling lower mold, which is a cooled lower mold, and cooling the target object while pressurizing the target object, wherein:
an intervening pad located between the upper mold and the target object includes:
- a deforming layer configured to flexibly deform according to a shape of the target object; and
- a heat insulating layer configured to intervene between the deforming layer and the target object and thermally insulate the target object from the deforming layer.

* * * * *